United States Patent
Lee et al.

(10) Patent No.: US 11,616,160 B2
(45) Date of Patent: Mar. 28, 2023

(54) TANDEM SOLAR CELL

(71) Applicant: SHANGRAO JINKO SOLAR TECHNOLOGY DEVELOPMENT CO., LTD, Jiangxi Province (CN)

(72) Inventors: Giwon Lee, Seoul (KR); Goohwan Shim, Seoul (KR)

(73) Assignee: SHANGRAO JINKO SOLAR TECHNOLOGY DEVELOPMENT CO., LTD, Jiangxi Province (CN)

( * ) Notice: Subject to any disclaimer, the term of this patent is extended or adjusted under 35 U.S.C. 154(b) by 0 days.

(21) Appl. No.: 17/414,223

(22) PCT Filed: Oct. 24, 2019

(86) PCT No.: PCT/KR2019/014044
§ 371 (c)(1),
(2) Date: Jun. 15, 2021

(87) PCT Pub. No.: WO2020/130318
PCT Pub. Date: Jun. 25, 2020

(65) Prior Publication Data
US 2022/0209039 A1   Jun. 30, 2022

(30) Foreign Application Priority Data

Dec. 18, 2018  (KR) .................... 10-2018-0164546

(51) Int. Cl.
*H01L 31/0725* (2012.01)
*H01G 9/20* (2006.01)
(Continued)

(52) U.S. Cl.
CPC ....... *H01L 31/0725* (2013.01); *H01G 9/2072* (2013.01); *H01L 31/02168* (2013.01);
(Continued)

(58) Field of Classification Search
CPC .......... H01L 31/0725; H01L 31/02168; H01L 31/022425; H01L 31/02363; H01L 31/0368; H01L 31/043; H01L 31/0687
See application file for complete search history.

(56) References Cited

U.S. PATENT DOCUMENTS 5,738,731 A * 4/1998 Shindo ................ H01L 31/0693
136/262
6,677,214 B1 * 1/2004 Shindo .................. C23C 16/486
438/378
(Continued)

FOREIGN PATENT DOCUMENTS

EP        3331029        6/2018
EP        3331029  A1 *  6/2018 ........... H01G 9/0029
(Continued)

OTHER PUBLICATIONS

KR 10-2018-0063866 A English transliaton as provided by "Patent Translate Powered by EPO and Google", translated on Apr. 18, 2022.*
(Continued)

*Primary Examiner* — Golam Mowla
(74) *Attorney, Agent, or Firm* — Tarolli, Sundheim, Covell & Tummino LLP

(57) ABSTRACT

A tandem solar cell includes a perovskite solar cell including a perovskite absorption layer, a silicon solar cell placed under the perovskite solar cell, a junction layer placed between the perovskite solar cell and the silicon solar cell, an upper electrode placed on the perovskite solar cell, and a lower electrode placed under the silicon solar cell.

5 Claims, 6 Drawing Sheets

(51) Int. Cl.
H01L 31/0216 (2014.01)
H01L 31/0224 (2006.01)
H01L 31/0236 (2006.01)
H01L 31/0368 (2006.01)

(52) U.S. Cl.
CPC .......... *H01L 31/02363* (2013.01); *H01L 31/022425* (2013.01); *H01L 31/0368* (2013.01)

(56) References Cited

U.S. PATENT DOCUMENTS

| | | | | |
|---|---|---|---|---|
| 2010/0012185 | A1* | 1/2010 | Schmid | H01L 31/022466 136/256 |
| 2016/0190377 | A1* | 6/2016 | Green | H01L 51/4213 438/74 |
| 2018/0158976 | A1* | 6/2018 | Ahn | H01L 31/0687 |
| 2018/0248052 | A1* | 8/2018 | Seok | H01L 31/022425 |

FOREIGN PATENT DOCUMENTS

| | | |
|---|---|---|
| JP | 6257847 | 1/2018 |
| KR | 101626248 | 5/2016 |
| KR | 101823597 | 1/2018 |
| KR | 20180063866 | 6/2018 |
| KR | 1020180063866 | 6/2018 |
| WO | WO2015151422 | 10/2015 |
| WO | WO2016198898 | 12/2016 |
| WO | WO2017105247 | 6/2017 |
| WO | WO2017105248 | 6/2017 |
| WO | WO-2017105248 A1 * | 6/2017 .......... H01L 27/302 |

OTHER PUBLICATIONS

KR 10-1626248 B1 English transliaton as provided by "Patent Translate Powered by EPO and Google", translated on Apr. 18, 2022.*

Eisenlohr et al., "Rear side sphere gratings for improved light trapping in crystalline silicon single junction and silicon-based tandem solar cells," Solar Energy Materials and Solar Cells, Nov. 2015, 142:60-65.

Extended European Search Report in European Appln. No. 19900237.9, dated Jul. 5, 2022, 15 pages.

Goldschmidt et al., "Monolithic Perovskite Silicon Tandem Solar Cells with Advanced Optics," Optical Nanostructures and Advanced Materials for Photovoltaics, Optical Society of America Nov. 2016, 3 pages.

Jeon et al., "Solvent engineering for high-performance inorganic-organic hybrid perovskite solar cells," Nature Materials, Sep. 2014, 13(9):897-903.

Wu, "Towards Highly Efficient Perovskite/c-Si Monolithic Tandem Solar Cells," Thesis for the degree of Doctor of Philosophy, The Australian National University, Research School of Engineering, Sep. 2018, 131 pages.

* cited by examiner

TANDEM SOLAR CELL

CROSS-REFERENCE TO RELATED APPLICATIONS

This application is a National Stage application under 35 U.S.C. § 371 of International Application No. PCT/KR2019/014044, filed on Oct. 24, 2019, which claims the benefit of Korean Application No. 10-2018-0164546, filed on Dec. 18, 2018. The disclosures of the prior applications are incorporated by reference in their entirety.

TECHNICAL FIELD

The present disclosure relates to a solar cell, and more particularly, to a solar cell including a perovskite solar cell having a perovskite absorption layer.

BACKGROUND ART

A crystalline silicon (c-Si) solar cell is a representative single junction solar cell and has dominated the solar cell market for decades.

However, the crystalline silicon solar cell is a technology that has a limit in light conversion efficiency. Even if overcoming the Shockley-Queisser limit, solar energy cannot be completely converted into electric energy. Therefore, since there is a limit to improving light conversion efficiency of the single junction solar cell such as the crystalline silicon solar cell, materials having various energy band gaps, such as a tandem solar cell or double-junction solar cell, may be used. In other words, the tandem solar cell can effectively use light energy in a wider spectrum than the single solar cell.

Recently, a new solar cell using a material having a perovskite crystal structure in a form of a mixture of inorganic matter and organic matter as a light absorber is attracting attention. In particular, a perovskite solar cell has a high light conversion efficiency comparable to that of a silicon solar cell, and can absorb light in a short wavelength region and convert the light into electric energy. Furthermore, the perovskite solar cell is made of a relatively inexpensive material, and can be formed in a low temperature process of 200° C. or lower, thereby reducing manufacturing cost.

Accordingly, attempts have been made to manufacture the tandem solar cell by stacking the perovskite solar cell capable of absorbing light in a short wavelength region on an upper portion of the crystalline silicon solar cell. However, even in such an attempt, recombination of carriers may easily occur due to impurities that form an emitter and a back surface field (B SF) in the crystalline silicon solar cell and saturation current density $J_0$ is high, light conversion efficiency may be reduced.

Recently, as in WO16198898A1, a tandem cell using a solar cell with a HIT cell structure using heterojunction of crystalline silicon and amorphous silicon as a lower cell and using a perovskite cell as an upper cell is proposed. In a tandem structure, as each of stacked separate sub-cells is designed to efficiently absorb photons in a specific frequency band of solar spectrum, the solar cell can be improved. However, such a lower cell is weak to high temperature and a process of manufacturing the lower cell is complicated.

Accordingly, the present disclosure proposes a tandem solar cell and a method for manufacturing the tandem solar cell including a perovskite solar cell having a perovskite absorption layer and a crystalline silicon solar cell that improves recombination of carriers and saturation current density $J_0$ and has a stable efficiency by being manufactured at high temperature.

DETAILED DESCRIPTION OF THE DISCLOSURE

Technical Problem

An aspect of the present disclosure is to provide a tandem solar cell with improved open-circuit voltage by enabling selective collection of electrons or holes in a silicon solar cell including a crystalline silicon substrate of a tandem solar cell including a perovskite solar cell and a silicon solar cell.

In addition, another aspect of the present disclosure is to provide a tandem solar cell with improved surface passivation performance of a silicon solar cell including a crystalline silicon substrate in a tandem solar cell including a perovskite solar cell and a silicon solar cell including a crystalline silicon substrate.

In addition, another aspect of the present disclosure is to provide a tandem solar cell with improved quality in recombination of carriers and saturation current density $J_0$ in a silicon solar cell including a crystalline silicon substrate of a tandem solar cell including a perovskite solar cell and a silicon solar cell.

Technical Solution

In order to solve the above problems, a tandem solar cell includes: a perovskite solar cell including a perovskite absorption layer; a silicon solar cell placed under the perovskite solar cell; a junction layer placed between the perovskite solar cell and the silicon solar cell; an upper electrode placed on the perovskite solar cell; and a lower electrode placed under the silicon solar cell. Furthermore, the silicon solar cell includes: a crystalline silicon substrate; a first conductive type semiconductor layer and a second conductive type semiconductor layer respectively disposed on a front surface or a rear surface of the crystalline silicon substrate; and a tunnel layer. Wherein the tunnel layer is disposed between either the first conductive type semiconductor layer or the second conductive type semiconductor layer disposed on the crystalline silicon substrate and the crystalline silicon substrate so that carriers generated in the first conductive type semiconductor layer or the second conductive type semiconductor layer are moved to the crystalline silicon substrate by a tunnel effect, and the first conductive type semiconductor layer or the second conductive type semiconductor layer disposed on a front surface of the crystalline silicon substrate is hydrogen passivated to prevent recombination of carriers.

Here, in the silicon solar cell, since carriers generated in the first conductive type semiconductor layer or the second conductive type semiconductor layer pass through the tunnel layer disposed on the crystalline silicon substrate to allow selective collection of electrons or holes, open-circuit voltage may be improved.

In addition, through the hydrogen passivation using hydrogen (H), defects such as dangling bonds present on a surface of the first conductive type semiconductor layer or a surface of the second conductive type semiconductor layer disposed on the crystalline silicon substrate are stabilized, to thereby prevent disappearing of carriers moved to the surface. This may improve a surface passivation performance of the silicon solar cell, thereby improving the efficiency of the tandem solar cell.

Accordingly, in the tandem solar cell of the present disclosure, since the recombination of carriers generated in the silicon solar cell and the saturation current density $J_0$ are improved by the hydrogen passivation, the light conversion efficiency of the tandem solar cell can be improved.

In an embodiment, hydrogen passivation may be performed by stacking a hydrogen ion supply layer on a front surface of the silicon solar cell. Further, at least a portion of the hydrogen ion supply layer may be removed to have an opening through which a portion of the first conductive type semiconductor layer or the second conductive type semiconductor layer formed on the front surface of the silicon solar cell is exposed. The opening allows the junction layer stacked on the front surface of the silicon solar cell and the silicon solar cell to be electrically connected to each other.

In addition, hydrogen passivation may be performed by exposing a surface of the first conductive type semiconductor layer or a surface of the second conductive type semiconductor layer formed on the front surface of the silicon solar cell to a hydrogen plasma.

The tandem solar cell of the present disclosure is implemented as a monolithic tandem solar cell by including a perovskite solar cell on a light-receiving surface to absorb light in a short wavelength region, and including a silicon solar cell on a rear surface of the perovskite solar cell. Accordingly, there may be provided a tandem solar cell with improved light conversion efficiency by using a wide range of a total absorption wavelength of sunlight.

In an embodiment, the first conductive type semiconductor layer or the second conductive type semiconductor layer in contact with the tunnel oxide layer may be formed of polycrystalline silicon. The polycrystalline silicon may be formed by low-pressure chemical vapor deposition. Accordingly, a back surface field or a front surface field on the tunnel layer may be easily formed.

In forming a p-n junction, the silicon solar cell may be designed in a front emitter or rear emitter structure. Accordingly, the perovskite solar cell may be formed by appropriately stacking an electron transport layer, a perovskite absorption layer, a hole transport layer, and a transparent conductive oxide electrode layer on a front surface of the junction layer according to the design of the silicon solar cell.

In an embodiment, an anti-reflection film may be further provided on the first conductive type semiconductor layer or the second conductive type semiconductor layer exposed on a rear surface of the silicon solar cell.

In addition, the present disclosure relates to a method for manufacturing a tandem solar cell, the method including steps of: forming a silicon solar cell; hydrogen passivation of supplying hydrogen to a first conductive type semiconductor layer or a second conductive type semiconductor layer formed on a front surface of the silicon solar cell; forming a junction layer on the front surface of the silicon solar cell; and forming a perovskite solar cell by stacking a perovskite solar cell including a perovskite absorption layer on a front surface of the junction layer. Further, the forming the perovskite solar cell includes steps of: stacking a tunnel layer and a polycrystalline silicon layer on one surface of a crystalline silicon substrate; a first impurity implantation of implanting a first conductive type impurity or a second conductive type impurity into the polycrystalline silicon layer to form the first conductive type semiconductor layer or the second conductive type semiconductor layer; and a second impurity implantation of implanting an impurity having a conductive type different from the impurity implanted in the first impurity implantation step into another surface of the crystalline silicon substrate.

In an embodiment, hydrogen is supplied from a hydrogen ion supply layer rich in hydrogen in the step of hydrogen passivation, and a portion of the hydrogen ion supply layer is removed by laser patterning or chemical etching to form an opening in a step of patterning.

In an embodiment, damage to the silicon solar cell due to laser patterning or chemical etching may be prevented by providing the polycrystalline silicon layer into which the first conductive type impurity or the second conductive type impurity is implanted on a rear surface of the hydrogen ion supply layer.

In an embodiment, in the step of hydrogen passivation, the hydrogen is supplied from a hydrogen plasma.

Advantageous Effects

According to the tandem solar cell according to the present disclosure, since carriers generated in the first conductive type semiconductor layer or the second conductive type semiconductor layer of the silicon solar cell pass through the tunnel layer disposed on the crystalline silicon substrate to allow selective collection of electrons or holes, open-circuit voltage may be improved.

In addition, through the hydrogen passivation using hydrogen (H), defects such as dangling bonds present on the surface of the first conductive type semiconductor layer or the second conductive type semiconductor layer disposed on the crystalline silicon substrate are stabilized, to thereby prevent disappearing of carriers moved to the surface. This may improve a surface passivation performance of the silicon solar cell, and therefore, the efficiency of the tandem solar cell can be improved.

Further, in the tandem solar cell of the present disclosure, since the recombination of carriers in the silicon solar cell and the saturation current density $J_0$ are improved by the hydrogen passivation, the light conversion efficiency of the tandem solar cell can be improved.

MODES FOR CARRYING OUT PREFERRED EMBODIMENTS

Figure 1:
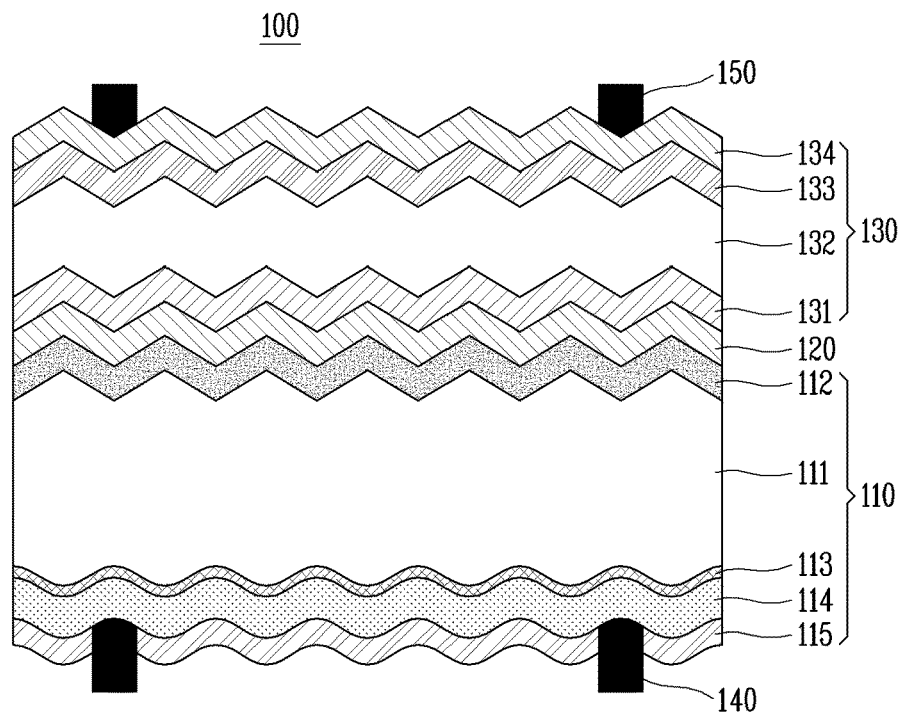
FIG. 1 is a conceptual view illustrating an embodiment of a tandem solar cell of the present disclosure.

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "portion" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

Also, an expression in which an element such as a layer, region or substrate is disposed "on" another component may be understood that the element may be disposed directly on another element or that an intermediate element may exist therebetween.

A tandem solar cell of the present disclosure includes a perovskite solar cell, a silicon solar cell, a junction layer, an upper electrode, and a lower electrode.

The perovskite solar cell may convert solar energy into electric energy by including a perovskite absorption layer, and, in particular, may absorb light in a short wavelength region of sunlight to easily convert the light into electric energy.

The junction layer is disposed between the perovskite solar cell and the silicon solar cell to allow the perovskite solar cell and the silicon solar cell to be electrically connected to each other so that carriers generated in the perovskite solar cell is transferred to the silicon solar cell. The junction layer allows light in a long wavelength transmitting through the perovskite solar cell to be incident to the silicon solar cell without transmission loss. Accordingly, the junction layer may be formed of at least one selected from a transparent conductive oxide (TCO), a carbonaceous conductive material, a metallic material, a conductive polymer material, and nano-crystalline silicon.

The junction layer may be formed by doping n-type or p-type impurities. For example, an n-type or p-type amorphous silicon layer may be applied as the junction layer. A thickness of the junction layer may be in a range of 10 nm to 100 nm. When the thickness of the junction layer is less than 10 nm, the junction layer does not have sufficient electrical conductivity, and thus it is not easy to collect electrons generated in the perovskite solar cell. Meanwhile, when the thickness of the junction layer exceeds 100 nm, the junction layer has sufficient electrical conductivity, but optical loss occurs in the junction layer.

Meanwhile, the silicon solar cell is disposed under (or on a rear surface of) the junction layer. The silicon solar cell includes a crystalline silicon substrate, a first conductive type semiconductor layer, a second conductive type semiconductor layer, and a tunnel layer.

In detail, the first conductive type semiconductor layer and the second conductive type semiconductor layer may be disposed on a front surface and a rear surface of the crystalline silicon substrate, respectively. The first conductive type semiconductor layer may be a p-type semiconductor layer containing a p-type impurity, and the second conductive type semiconductor layer may be an n-type semiconductor layer containing an n-type impurity.

However, the present disclosure is not necessarily limited thereto, and an example in which the first conductive type is an n-type and the second conductive type is a p-type may also be possible. In the following description of the present disclosure, for convenience of description, the first conductive type semiconductor layer is a semiconductor layer containing a p-type impurity, and the second conductive type semiconductor layer is a semiconductor layer containing an n-type impurity.

The p-type impurity is a group 3 element such as boron (B), aluminum (Al), gallium (Ga), and indium (In). Meanwhile, the n-type impurity may be a group 5 element such as phosphorus (P), arsenic (As), bismuth (Bi), and antimony (Sb).

The tunnel layer is disposed between either the first conductive type semiconductor layer or the second conductive type semiconductor layer disposed on the crystalline silicon substrate and the crystalline silicon substrate, so that carriers generated in the first conductive type semiconductor layer or the second conductive type semiconductor layer are moved to the crystalline silicon substrate by a tunnel effect.

Further, either the first conductive type semiconductor layer or the second conductive type semiconductor layer disposed on the crystalline silicon substrate and in contact with the tunnel layer is formed of polycrystalline silicon.

Accordingly, in the silicon solar cell, polycrystalline silicon on a rear surface of the tunnel layer is doped with impurities to form a potential difference instead of being doped with impurities directly penetrated into the crystalline silicon substrate, and therefore, recombination of carriers and saturation current density $J_0$ of the silicon solar cell can be improved by the doping.

In addition, in the silicon solar cell, since carriers generated in the first conductive type semiconductor layer or the second conductive type semiconductor layer pass through the tunnel layer disposed on the crystalline silicon substrate to allow selective collection of electrons or holes, open-circuit voltage can be improved.

Accordingly, in the tandem solar cell of the present disclosure, since the recombination of carriers and the saturation current density $J_0$ in the silicon solar cell are improved, light conversion efficiency of the tandem solar cell can be improved. Furthermore, since the tandem solar cell of the present disclosure is provided with the perovskite solar cell including a perovskite absorption layer on a light-receiving surface, the tandem solar cell may be implemented as a monolithic tandem solar cell. Accordingly, the tandem solar cell absorbs light in a short wavelength region at a front surface of the tandem solar cell and absorbs light in a long wavelength region at a rear surface of the tandem solar cell to move a threshold wavelength toward the long wavelength, and thus has improved light conversion efficiency in which an entire absorption wavelength region is widely used.

The tunnel layer may be formed of a dielectric material of silicon carbide (SiCx) or silicon oxide (SiOx). In addition, the tunnel layer is formed of silicon nitride (SiNx), aluminum oxide (AlOx), and silicon oxynitride (SiOxNy), and is formed by an oxidation process or deposition. In addition, the tunnel layer has a thickness of 3 to 15 angstrom Å. Since the tunnel layer moves carriers through a tunnel effect, a thickness for an optimum probability of tunneling should be formed, and the thickness for the optimum probability of tunneling is 3 to 15 angstrom Å in the present disclosure.

Meanwhile, the polycrystalline silicon may be deposited on the tunnel layer using low pressure chemical vapor deposition (LPCVD). Furthermore, since the polycrystalline silicon has a conductive type of either a first conductive type semiconductor layer or a second conductive type semiconductor layer as described above, a first conductive type impurity or a second conductive type impurity may be implanted. The impurities may be implanted into the polycrystalline silicon through diffusion and ion implantation processes.

The first conductive type semiconductor layer or the second conductive type semiconductor layer disposed on the front surface of the crystalline silicon substrate may prevent recombination of carriers by being hydrogen passivated. Specifically, through the hydrogen passivation using hydrogen (H), defects such as dangling bonds present on the surface of the first conductive type semiconductor layer or the second conductive type semiconductor layer disposed on the front surface of the crystalline silicon substrate are stabilized, to thereby prevent disappearing of carriers moved to the surface. This may improve a surface passivation performance of the silicon solar cell to improve the efficiency of the tandem solar cell.

The hydrogen passivation may be performed with hydrogen supplied from an insulating film rich in hydrogen. Specifically, the hydrogen passivation may be performed with hydrogen of hydrogenated silicon nitride (SiNx) to stabilize defects.

In addition, in order to perform the hydrogen passivation, the first conductive type semiconductor layer or the second conductive type semiconductor layer subjected to the hydrogen passivation may be exposed to a hydrogen plasma. Accordingly, hydrogen may be implanted into a semiconductor layer exposed to the hydrogen plasma to stabilize defects.

Meanwhile, the lower electrode may be disposed on a rear surface of the silicon solar cell, so as to be electrically connected to the silicon solar cell. On the other hand, the upper electrode may be disposed on the front surface of the perovskite solar cell, so as to be electrically connected to the perovskite solar cell.

The lower electrode and the upper electrode may be electrically connected by being connected to each other through an external circuit. Accordingly, in the tandem solar cell of the present disclosure, carriers formed by receiving solar energy may be collected to generate electric energy.

Further, the lower electrode and the upper electrode are formed in a grid shape to prevent shading loss of incident light on the tandem solar cell of the present disclosure, thereby improving light conversion efficiency. In particular, the upper electrode disposed on the light-receiving surface of the tandem solar cell of the present disclosure may have a wider gap than the lower electrode in order to prevent loss of incident sunlight.

Hereinafter, the present disclosure will be described with respect to a detailed embodiment of the tandem solar cell. Furthermore, in embodiments described below, the same or similar configurations to the foregoing example and the description thereof will be substituted by the earlier description. In addition, in the following description of the present disclosure, for convenience, the first conductive type semiconductor layer is a semiconductor layer containing a p-type impurity, and the second conductive type semiconductor layer is a semiconductor layer containing an n-type impurity. This is only to reduce confusion in describing various embodiments, and the present disclosure is not necessarily limited thereto.

FIG. 1 is a conceptual view illustrating an embodiment of a tandem solar cell 100 of the present disclosure.

Referring to FIG. 1, the tandem solar cell 100 includes a silicon solar cell 110, a junction layer 120, a perovskite solar cell 130, a lower electrode 140, and an upper electrode 150.

The tandem solar cell 100 may be formed by sequentially stacking the lower electrode 140, the silicon solar cell 110, the junction layer 120, the perovskite solar cell 130, and the upper electrode 150.

First, the silicon solar cell 110 will be described. The silicon solar cell 110 may include a crystalline silicon substrate 111, a first conductive type semiconductor layer 112, a tunnel layer 113, and a second conductive type semiconductor layer 114. In addition, an anti-reflection film 115 may be disposed on a rear surface of the silicon solar cell 110. However, the anti-reflection film 115 is not necessarily provided, and may be omitted if necessary.

The crystalline silicon substrate 111 may be formed of a second conductive type semiconductor layer. When the crystalline silicon substrate 111 is formed of a second conductive type semiconductor layer containing an n-type impurity, a carrier lifetime of the crystalline silicon substrate 111 can be improved due to a longer diffusion length than the first conductive type semiconductor layer containing a p-type impurity of the same or similar grade. This may further improve an efficiency of the silicon solar cell 110.

Furthermore, a front surface and a rear surface of the crystalline silicon substrate 111 may be textured to have an unevenness. The unevenness is formed on a surface of the crystalline silicon substrate 111 and has pyramid shapes with irregular sizes, thereby reducing reflectance of incident light and increasing light conversion efficiency in a photoelectric transducer including an amorphous semiconductor layer.

In other words, the first conductive type semiconductor layer 112, the tunnel layer 113, and the second conductive type semiconductor layer 114 formed on the front surface or the rear surface of the crystalline silicon substrate 111 having the textured uneven surface may also have uneven surfaces. However, the front surface and rear surface of the crystalline silicon substrate 111 are not limited to the uneven surface, and may be processed flat if necessary, or may have a rounded surface partially etched by an additional process. This may be appropriately adjusted so that the first conductive type semiconductor layer 112, the tunnel layer 113, and the second conductive type semiconductor layer 114 are stably formed on the front surface or the rear surface of the crystalline silicon substrate 111.

The first conductive type semiconductor layer 112 forms an emitter on the front surface of the crystalline silicon substrate 111 to form a p-n junction. Furthermore, the first conductive type semiconductor layer 112 may be hydrogen passivated to prevent recombination of carriers.

Meanwhile, the second conductive type semiconductor layer 114 has a conductive type same as that of the crystalline silicon substrate 111 and forms a back surface field (BSF) having a higher impurity concentration than the crystalline silicon substrate 111.

The tunnel layer 113 is formed between the crystalline silicon substrate 111 and the second conductive type semiconductor layer 114 to allow selective collection of carriers. In detail, the tunnel layer 113 prevents movement of holes toward the second conductive type semiconductor layer 114 forming a back surface field, and facilitates movement of electrons. Accordingly, loss of carriers due to recombination at the rear surface of the crystalline silicon substrate 111 may be reduced.

In addition, since the tunnel layer 113 moves carriers, the tunnel layer should have a thickness for an optimum probability of tunneling, and the thickness of the tunnel layer 113 for the optimum probability of tunneling may be in a range of 3 to 15 Å in the present disclosure. Since the tunnel layer 113 has a thin thickness, it is difficult to uniformly form the surface of the tunnel layer 113 when the surface of the tunnel layer 113 is excessively curved. Accordingly, the textured uneven surface of the rear surface of the crystalline silicon substrate 111 may be processed flat or may be rounded by partially etching the textured uneven surface as shown in the drawing. In other words, the surface of the crystalline silicon substrate 111 on which the tunnel layer 113 is formed has a surface morphology suitable for forming the tunnel layer 113.

The second conductive type semiconductor layer 114 may include polycrystalline silicon. Accordingly, the second conductive type semiconductor layer 114 may be deposited through low-pressure chemical vapor deposition to easily form a back surface field on the tunnel layer 113, and may be formed by implanting second conductive type impurities. For example, the second conductive type semiconductor layer 114 may be formed by implanting impurities of a pentavalent element such as phosphoryl chloride (POCl 3) or phosphoric acid (H 3 PO 4) into polycrystalline silicon.

The anti-reflection film 115 may be formed on a rear surface of the second conductive type semiconductor layer 114. The anti-reflection film 115 may serve to minimize reflection of light incident on the rear surface of the silicon solar cell 110. The anti-reflection film 115 may be formed by various processes such as physical vapor deposition (PECVD) or chemical vapor deposition (CVD). Further, the anti-reflection film 115 may be formed in a single layer or multi-layered structure including at least one selected from aluminum oxide (AlOx), silicon nitride (SiNx), silicon oxide (SiOx), and silicon oxynitride (SiOxNy).

The lower electrode 140 may be formed of a material in which electrons formed in the tandem solar cell is easily moved by being brought into contact with the second conductive type semiconductor layer 114. The lower electrode 140 may be formed of conductive material of at least one selected from nickel (Ni), copper (Cu), silver (Ag), aluminum (Al), tin (Sn), zinc (Zn), indium (In), titanium (Ti), gold (Au), and a group consisting of combinations thereof, or other conductive metal materials. The lower electrode 140 may be formed by various methods such as screen printing using a metal paste, plating, thermal evaporation, and sputtering.

Hereinafter, the perovskite solar cell 130 and the upper electrode 150 disposed on a front surface of the junction layer 120 will be described.

The perovskite solar cell 130 may be formed by sequentially stacking an electron transport layer 131, a perovskite absorption layer 132, a hole transport layer 133, and a transparent conductive oxide electrode layer 134 on the front surface of the junction layer 120.

The silicon solar cell 110 of the tandem solar cell 100 is designed as a solar cell in which holes are moved to the front surface and electrons are moved to the rear surface of the silicon solar cell 110 to form electric energy. Accordingly, the hole transport layer 133 is formed on a front surface of the perovskite solar cell 130 and the electron transport layer 131 is formed on a rear surface of the perovskite solar cell 130 to implement a monolithic tandem solar cell. In another embodiment, when the solar cell is designed to form electric energy in a manner that electrons are moved to the front surface and holes are moved to the rear surface as opposed to the silicon solar cell 100, positions of the electron transport layer and the hole transport layer of the perovskite solar cell may be interchanged as needed.

The electron transport layer 131 formed on the front surface of the junction layer 120 may be formed of a transparent conductive oxide (TCO) with high electrical conductivity, or a carbonaceous conductive material.

Specifically, the transparent conductive oxide implementing the electron transport layer 131 may be Ti oxide, Zn oxide, In oxide, Sn oxide, W oxide, Nb oxide, Mo oxide, Mg oxide, Zr oxide, Sr oxide, Yr oxide, La oxide, V oxide, Al oxide, Y oxide, Sc oxide, Sm oxide, Ga oxide, In oxide, SrTi oxide or the like. Preferably, the electron transport layer 131 may include at least one selected from ZnO, TiO 2, SnO 2, WO 3, and TiSrO 3. Furthermore, graphene, carbon nanotubes, or fullerene (C 60) may be used as the carbonaceous conductive material.

In the perovskite absorption layer 132, hole-electron pairs generated by receiving light energy from the sun may be decomposed into electrons or holes. In an embodiment, electrons formed in the perovskite absorption layer 132 may be transferred to the electron transport layer 131, and holes formed in the perovskite absorption layer 132 may be transferred to the hole transport layer 133.

The perovskite absorption layer 132 may contain an organic halide perovskite such as methyl ammonium iodide (MAI), and formamidinium iodide (FAI), or a metal halide perovskite such as lead iodide (PbI 2), bromine iodide (PbBr), and lead chloride (PbCl 2). In other words, the perovskite absorption layer 132 may have a multilayered structure including at least one of organic halide perovskite and metal halide perovskite.

Specifically, the perovskite absorption layer 132 may be expressed as AMX 3 (where A is a monovalent organic ammonium cation or metal cation; M is a divalent metal cation; and X is a halogen anion). Non-limiting examples of compounds having a perovskite structure include CH3NH3PbI3, CH3NH3PbIxCl3-x, CH3NH3PbIxBr3-x, CH3NH3PbClxBr3-x, HC(NH2)2PbI3, HC(NH2)2PbIxCl3-x, HC(NH2)2PbIxBr3-x, HC(NH2)2PbClxBr3-x, (CH3NH3)(HC(NH2)2)1-yPbI3, (CH3NH3)(HC(NH2)2)1-y PbIxCl3-x, (CH3NH3)(HC(NH2)2)1-yPbIxBr3-x, (CH3NH3)(HC(NH2)2)1-y PbClxBr3-x, or the like (0=x, y=1). In addition, a compound in which A of AMX3 is partially doped with Cs may also be used.

The perovskite absorption layer 132 may be formed by a single-step spin-coating method, a multi-step spin-coating method, a dual-source vapor deposition method, and a vapor-assisted solution process.

The hole transport layer 133 may be formed of conductive polymer. Specifically, for the conductive polymer, polyaniline, polypyrrole, polythiophene, poly-3,4-ethylenedioxythiophene polystyrene sulfonate (PEDOT-PSS), poly-[bis(4-phenyl)(2,4,6)-Trimethylphenyl)amine] (PTAA), Spiro-MeOTAD, or polyaniline-camposulfonic acid (PANI-CSA), and the like may be used.

The conductive oxide electrode layer 134 may be implemented as a transparent conductive oxide (TCO) with high electrical conductivity. Furthermore, the upper electrode 150 may be formed of a material having higher electrical conductivity than the conductive oxide electrode layer 134, thereby improving carrier collection efficiency and reducing resistance.

When temperature of heat treatment exceeds 150° C. in forming the upper electrode 150, the perovskite absorption layer 132 may be deteriorated due to the heat. Accordingly, the upper electrode 150 may be formed by screen printing using a low-temperature paste which does not contain glass frit and can be easily sintered even at a low temperature. Furthermore, the perovskite absorption layer 132 may be formed by various methods such as plating, thermal evaporation, and sputtering in a temperature range in which the perovskite absorption layer 132 is not deteriorated.

In addition, a front anti-reflection film (not illustrated) may be further provided on the front surface of the perovskite solar cell 130. In detail, the front anti-reflection film may be stacked on an exposed front surface of the conductive oxide electrode layer 134 and on a front surface of the upper electrode 150. In addition, the front anti-reflection film may be formed in a single layer or multi-layered structure including at least one selected from magnesium fluoride (MgF 2), silicon oxide (SiOx), and titanium oxide (TiOx). This may effectively reduce surface reflectance of the tandem solar cell 100, thereby improving light conversion efficiency of the tandem solar cell.

FIGS. 2 to 8 are conceptual views illustrating various embodiments of tandem solar cells 200, 300, 400, 500, 600, 700, and 800 of the present disclosure.

Hereinafter, various embodiments of the tandem solar cells 200, 300, 400, 500, 600, 700, and 800 of the present disclosure will be described with reference to FIGS. 2 to 8. In another embodiment described below, the same or similar reference numerals are designated to the same or similar configurations to FIG. 1, and the description thereof will be substituted by the earlier description.

Figure 2:
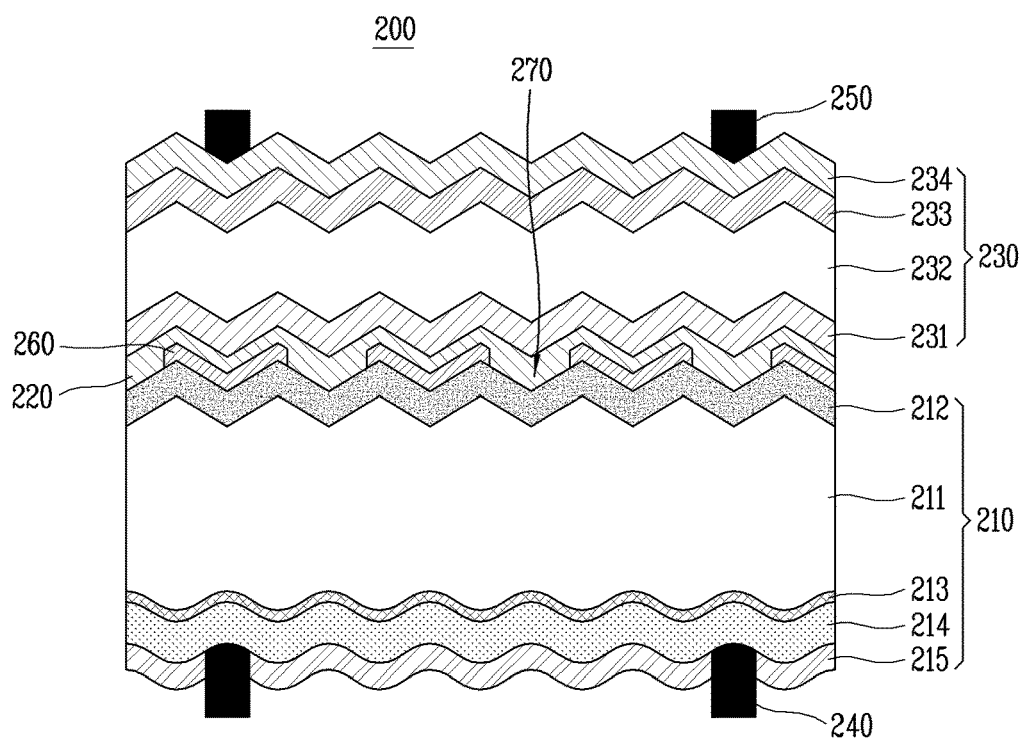
FIGS. 2 to 8 are conceptual views illustrating various embodiments of tandem solar cells of the present disclosure.

Referring to FIG. 2, a tandem solar cell 200 includes a silicon solar cell 210, a junction layer 220, a perovskite solar cell 230, a lower electrode 240, and an upper electrode 250. In addition, the tandem solar cell 200 is provided with a hydrogen ion supply layer 260 between the junction layer 220 and a first conductive type semiconductor layer 212 disposed on a front surface of the silicon solar cell 210. In addition, an anti-reflection film 215 may be disposed on a rear surface of the silicon solar cell 200.

The hydrogen ion supply layer 260 may be formed by supplying hydrogen from an insulating film rich in hydrogen. For example, the hydrogen ion supply layer 260 may be formed of hydrogenated silicon nitride (SiNx). Accordingly, hydrogen is supplied to the first conductive type semiconductor layer 212, and therefore, the first conductive type semiconductor layer 212 is hydrogen passivated to reduce surface defects.

The hydrogen ion supply layer 260 may be patterned to have an opening 270 through which a portion of the first conductive type semiconductor layer 212 is exposed. Here, the first conductive type semiconductor layer 212 disposed on the opening 270 may be recrystallized.

The opening 270 may be filled with the junction layer 220. Accordingly, the first conductive type semiconductor layer 212 is brought into contact with the junction layer 220 to allow electrons formed in the perovskite solar cell 230 to move to the silicon solar cell 210, and to allow holes formed in the silicon solar cell 210 to move to the perovskite solar cell 230.

Figure 3:
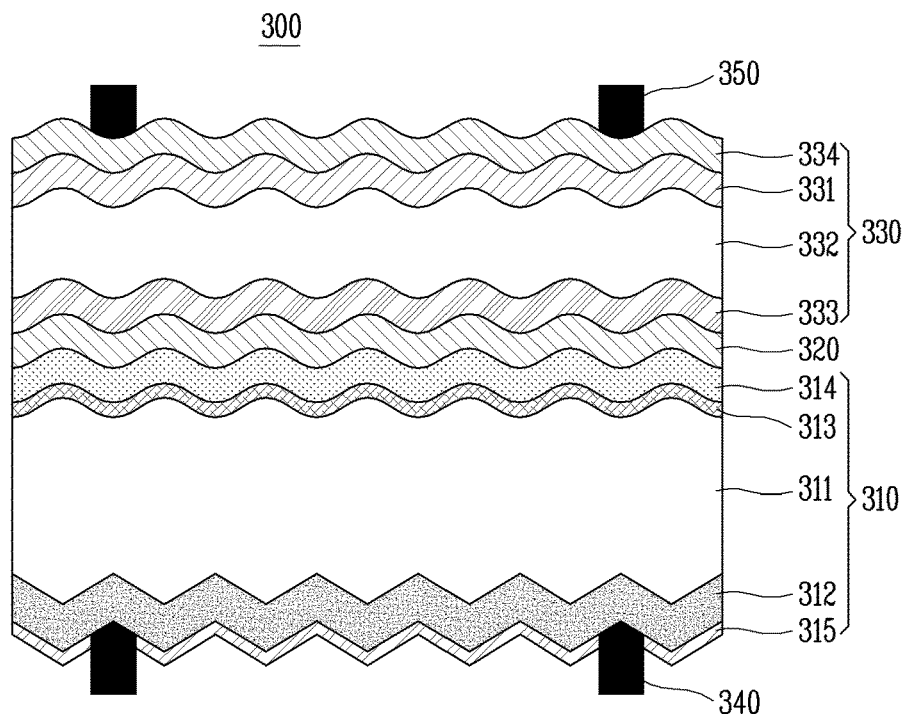
Figure 4:
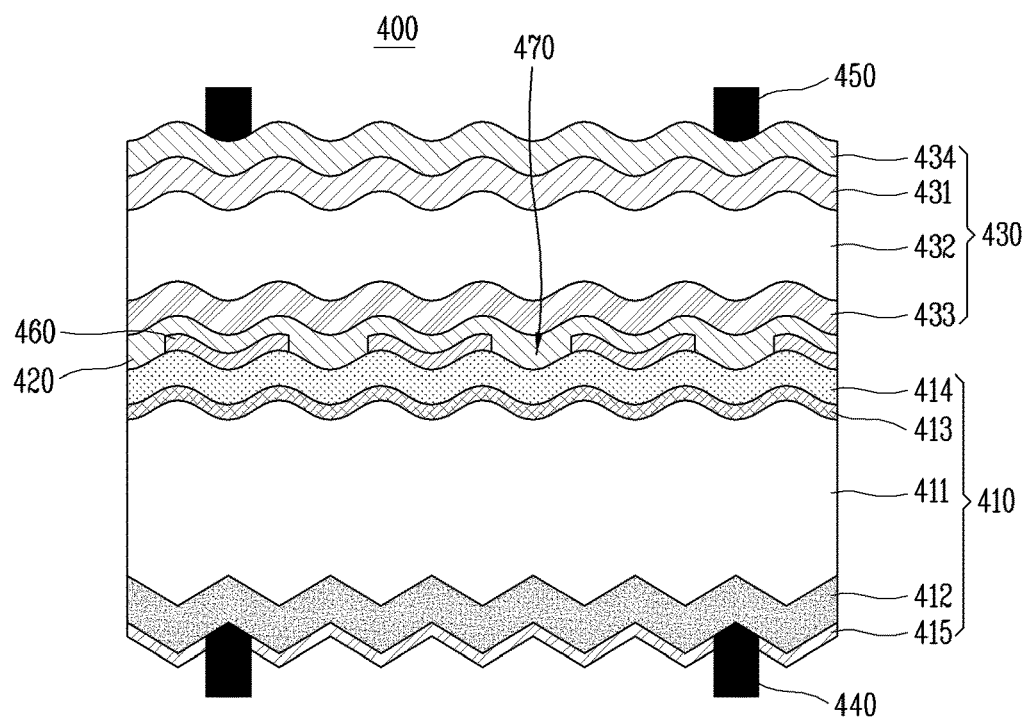

Referring to FIGS. 3 and 4, a silicon solar cell 310, 410 may be formed by sequentially stacking a first conductive type semiconductor layer 312, 412, a crystalline silicon substrate 311, 411, a tunnel layer 313, 413, and a second conductive type semiconductor layer 314, 414 on a front surface of a lower electrode 340, 440. The crystalline silicon substrate 311, 411 contains second conductive type impurities. Furthermore, the second conductive type semiconductor layer 314, 414 is formed of polycrystalline silicon. In addition, an anti-reflection film 315, 415 may be disposed on a rear surface of the silicon solar cell 310, 410.

The silicon solar cell 310, 410 has a rear emitter structure in which a p-n junction is formed by including the first conductive type semiconductor layer 312, 412 on the rear surface of the silicon solar cell 310, 410. In addition, the first conductive type semiconductor layer 312, 412 may be hydrogen passivated by receiving hydrogen ions from the anti-reflection film 315, 415 disposed on a rear surface of the first conductive type semiconductor layer 312, 412.

Meanwhile, the silicon solar cell 310, 410 forms a structure having a front surface field (FSF) on the front surface of the silicon solar cell 310, 410. Accordingly, the silicon solar cell 310, 410 may be designed to form electric energy by electrons being moved to the front surface of the silicon solar cell 310, 410 and holes being moved to the rear surface of the silicon solar cell 310, 410.

Here, an electron transport layer 331, 431 and a hole transport layer 333, 433 of a perovskite solar cell 330, 430 may be formed in an arrangement opposite to the arrangement in FIGS. 1 and 2 described above. In detail, the electron transport layer 331, 431 is disposed on a front surface of the perovskite solar cell 330, 430, and the hole transport layer 333, 433 is disposed on a rear surface of the perovskite solar cell 330, 430 to implement a tandem solar cell.

Referring to FIG. 4, the tandem solar cell 400 may be provided with a hydrogen ion supply layer 460 and an opening 470, between a junction layer 420 and a second conductive type semiconductor layer 414 disposed on a front surface of the silicon solar cell 410. Here, the second conductive type semiconductor layer 414 disposed on the opening 470 may be recrystallized.

Referring to FIGS. 5 to 8, first conductive type semiconductor layers 512, 612, 712, and 812 of solar cells 500, 600, 700, and 800 may be formed of polycrystalline silicon. In FIGS. 1 to 4 described above, second conductive type semiconductor layers 114, 214, 314, and 414 are formed of polycrystalline silicon. Accordingly, the second conductive type semiconductor layers 114, 214, 314, and 414 formed of polycrystalline silicon in FIGS. 1 to 4 each forms a front surface field or a back surface field. However, the first conductive type semiconductor layers 512, 612, 712, and 812 formed of polycrystalline silicon of FIGS. 5 to 8 each may form an emitter.

The first conductive type semiconductor layer 512, 612, 712, 812 may be deposited through low-pressure chemical vapor deposition to easily form a back surface field on a tunnel layer 513, 613, 713, 813, and may be formed by implanting a first conductive type impurity. For example, the first conductive type semiconductor layer 512, 612, 712, 812 may be formed by implanting an impurity of a trivalent element such as diborane (B 2H 6) or boron tribromide (BBr 3) into polycrystalline silicon.

Figure 5:
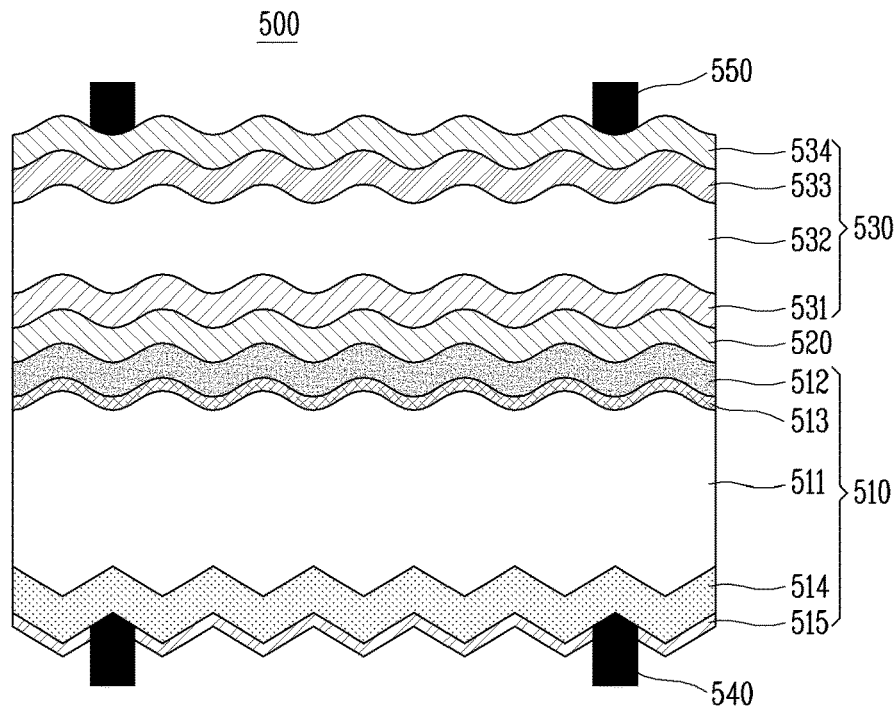
Figure 6:
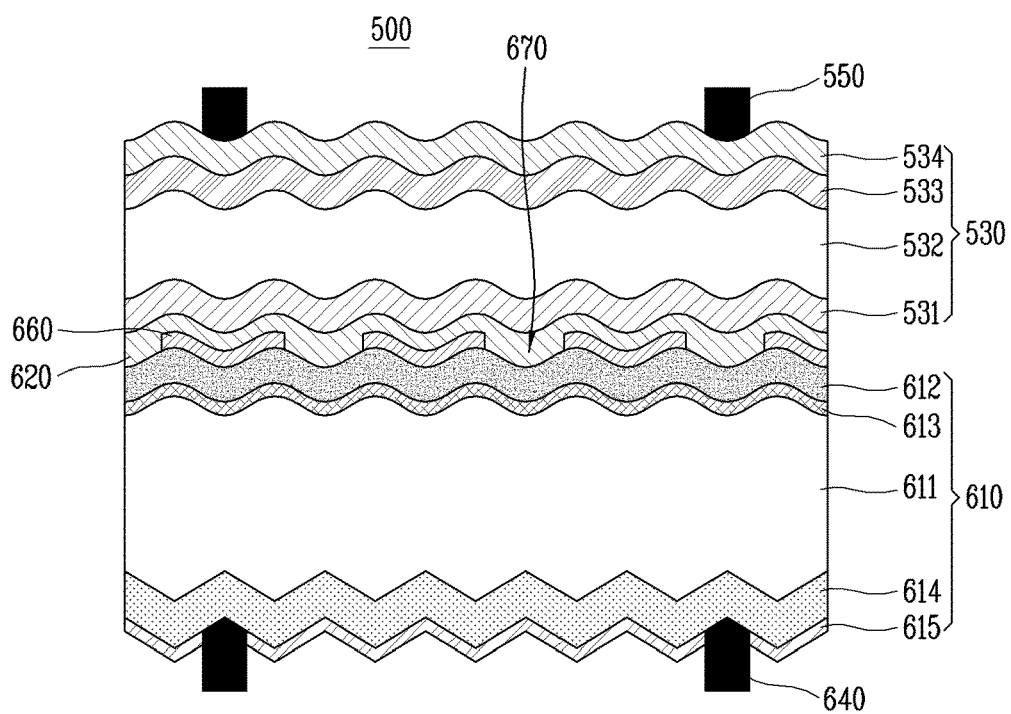

Referring to FIGS. 5 and 6, the first conductive type semiconductor layer 512, 612 is formed of polycrystalline silicon, and a silicon solar cell 510, 610 may be formed by sequentially stacking a second conductive type semiconductor layer 514, 614, a crystalline silicon substrate 511, 611, a tunnel layer 513, 613, and a first conductive type semiconductor layer 512, 612 on a front surface of a lower electrode 540, 640. The crystalline silicon substrate 511, 611 contains second conductive type impurities. In addition, the second conductive type semiconductor layer 514, 614 may be hydrogen passivated by receiving hydrogen ions from an anti-reflection film 515, 615 disposed on a rear surface of the second conductive type semiconductor layer 514, 614 to reduce surface defects.

In the silicon solar cell 510, 610, a p-n junction is formed by bonding the first conductive type semiconductor layer 512, 612 formed of polycrystalline silicon with the crystalline silicon substrate 511, 611. Accordingly, the silicon solar cell 510, 610 may be designed to form electric energy by holes being moved to the front surface of the silicon solar cell 510, 610 and electrons being moved to the rear surface of the silicon solar cell 510, 610.

Accordingly, a perovskite solar cell 530, 630 of the tandem solar cell 500, 600 may be formed by sequentially stacking an electron transport layer 531, 631, a perovskite absorption layer 532, 632, a hole transport layer 533, 633, and a transparent conductive oxide electrode layer 534, 634 on a front surface of a junction layer 520, 620.

Referring to FIG. 6, the tandem solar cell 600 may be provided with a hydrogen ion supply layer 660 and an opening 670, between the junction layer 620 and a first conductive type semiconductor layer 612 disposed on a front surface of the silicon solar cell 610. Here, the first conductive type semiconductor layer 612 disposed on the opening 670 may be recrystallized.

Figure 7:
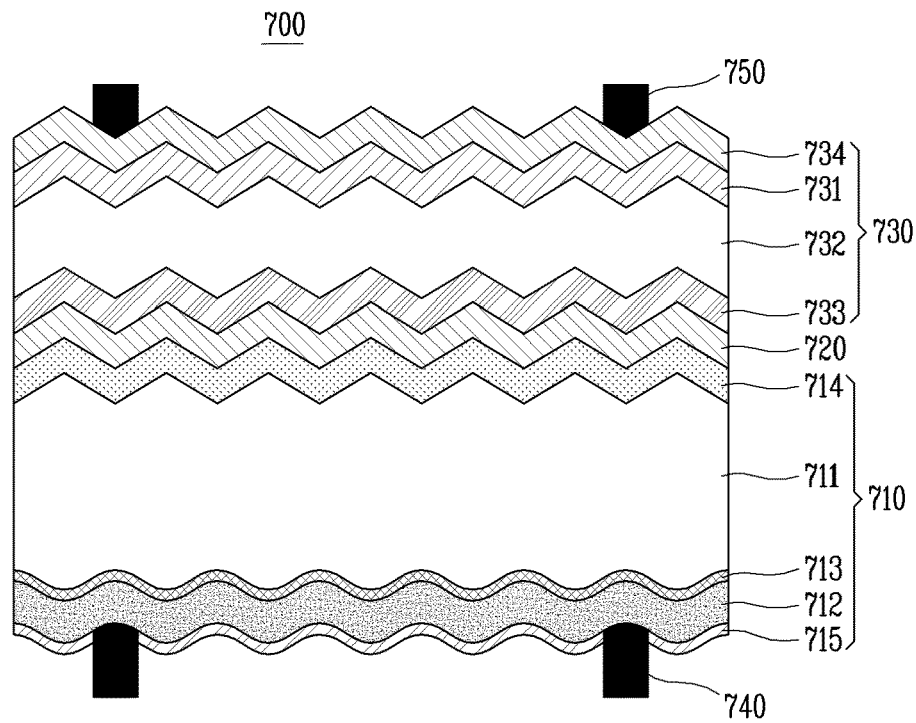
Figure 8:
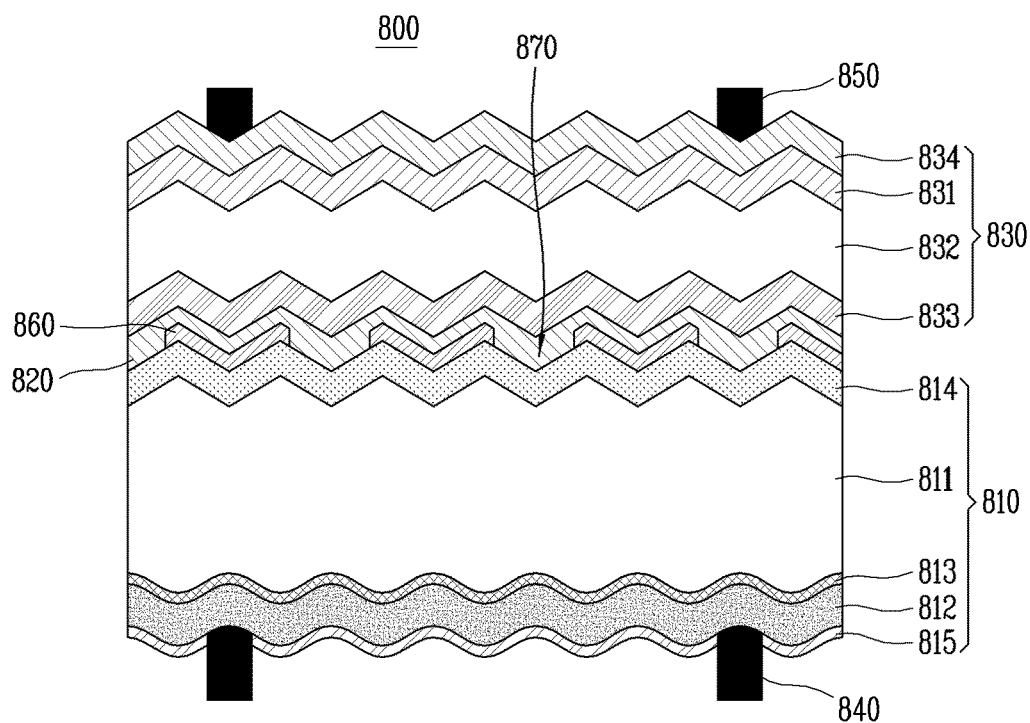

Referring to FIGS. 7 and 8, a silicon solar cell 710, 810 may be formed by sequentially stacking a first conductive type semiconductor layer 712, 812, a tunnel layer 713, 813, a crystalline silicon substrate 711, 811, and a second conductive type semiconductor layer 714, 814 on a front surface of a lower electrode 740, 840. The crystalline silicon substrate 711, 811 contains second conductive type impurities. Furthermore, the first conductive type semiconductor layer 712, 812 is formed of polycrystalline silicon. In addition, an anti-reflection film 715, 815 may be disposed on a rear surface of the silicon solar cell 710, 810.

Accordingly, the silicon solar cell 710, 810 has a rear emitter structure in which a p-n junction is formed by including the first conductive type semiconductor layer 712, 812 on the rear surface of the silicon solar cell 710, 810. Meanwhile, the silicon solar cell 710, 810 forms a structure having a front surface field (FSF) on the front surface of the silicon solar cell 710, 810 by the second conductive type semiconductor layer 714, 814. Accordingly, the silicon solar cell 710, 810 may be designed to form electric energy by electrons being moved to the front surface of the silicon solar cell 710, 810 and holes being moved to the rear surface of the silicon solar cell 710, 810.

Here, a perovskite solar cell 730, 830 is formed by sequentially stacking a hole transport layer 733, 833, a perovskite absorption layer 732, 832, an electron transport layer 731, 831, and a transparent conductive oxide electrode layer 734, 834 on a front surface of a junction layer 720, 820. Accordingly, the silicon solar cell 710, 810 and the perovskite solar cell 730, 830 form a tandem solar cell.

Referring to FIG. 8, the tandem solar cell 800 may be provided with a hydrogen ion supply layer 860 and an opening 870, between the junction layer 820 and a second conductive type semiconductor layer 814 disposed on a front surface of the silicon solar cell 810. Here, the second conductive type semiconductor layer 814 disposed on the opening 870 may be recrystallized.

Figure 9:
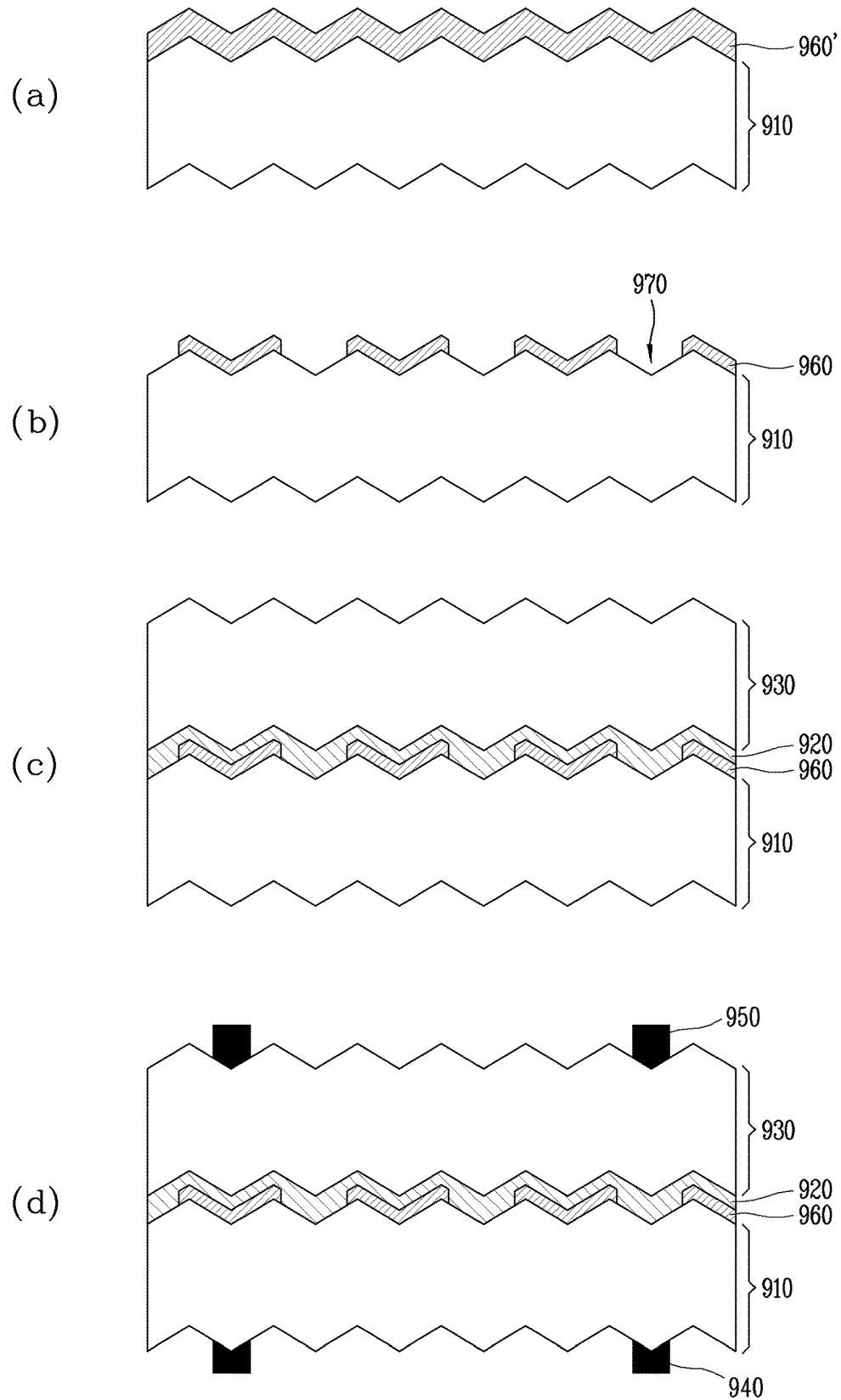
FIG. 9 is a conceptual view illustrating an embodiment of a method for manufacturing a tandem solar cell of the present disclosure.

FIG. 9 is a conceptual view illustrating an embodiment of a method for manufacturing a tandem solar cell 900 of the present disclosure.

Referring to FIG. 9, in (a) of FIG. 9, a hydrogen ion supply layer 960' is stacked on a front surface of a silicon solar cell 910.

In manufacturing the silicon solar cell 910, first, a tunnel layer and a polycrystalline silicon layer are stacked on one surface of a crystalline silicon substrate. Subsequently, a first impurity implantation step of implanting a first conductive type impurity or a second conductive type impurity into the polycrystalline silicon layer is performed to form a first conductive type semiconductor layer or a second conductive type semiconductor layer. Further, a step of second impurity implantation, in which an impurity having a conductive type different from the impurity implanted in the step of the first impurity implantation is implanted into another surface of the crystalline silicon substrate, is performed. Thereafter, the silicon solar cell 910 including the crystalline silicon substrate, the tunnel layer, the first conductive type semiconductor layer, and the second conductive type semiconductor layer may be prepared. In addition, an anti-reflection film may be provided on a rear surface of the silicon solar cell 910.

Referring back to the drawing, hydrogen is supplied to a surface of the first conductive type semiconductor layer or a surface of the second conductive type semiconductor layer formed on a front surface of the silicon solar cell 910 by the hydrogen ion supply layer 960' to thereby stabilize defects such as dangling bonds. Accordingly, the front surface of the silicon solar cell 910 may be hydrogen passivated to prevent recombination of carriers.

Subsequently, in (b) of FIG. 9, at least a portion of the hydrogen ion supply layer 960' is removed. Accordingly, a hydrogen ion supply layer 960 may be formed, and an opening 970 through which a portion of the first conductive type semiconductor layer or the second conductive type semiconductor layer formed on the front surface of the silicon solar cell 910 is exposed may be provided. The opening 970 allows a junction layer 920 which is to be stacked on the front surface of the silicon solar cell 910 and the silicon solar cell 910 to be electrically connected to each other. Here, removal of the hydrogen ion supply layer 960' may be performed by laser patterning or chemical etching. Further, by removing the entire hydrogen ion supply layer 960', the first conductive type semiconductor layer or the second conductive type semiconductor layer formed on the front surface of the silicon solar cell 910 and the junction layer 920 may be electrically connected to each other.

In particular, when polycrystalline silicon is formed on the front surface of the silicon solar cell 910 as illustrated in FIGS. 3 to 6 and the hydrogen ion supply layer 960' is removed by laser patterning, damage of the silicon solar cell 910 resulting from the laser process does not lead to a decrease in the efficiency of the silicon solar cell 910. This is because damage of the crystalline silicon substrate, which may directly affect decrease in the efficiency of the silicon solar cell 910, is prevented during the laser process, although the polycrystalline silicon is recrystallized during the laser patterning. Accordingly, when the hydrogen ion supply layer 960' is removed by laser patterning, it is preferable that polycrystalline silicon is disposed on a rear surface of the hydrogen ion supply layer 960'.

Further, only a portion of the hydrogen ion supply layer 960' may be patterned as described above when removing the hydrogen ion supply layer 960' by laser patterning, or the entire hydrogen ion supply layer 960' may be removed by laser patterning. Even in this case, although polycrystalline silicon is recrystallized during the laser patterning, it does not directly affect the decrease in the efficiency of the silicon solar cell 910.

In (c) of FIG. 9, the junction layer 920 and a perovskite solar cell 930 are formed on the front surface of the silicon solar cell 910 on which the hydrogen ion supply layer 960 and the opening 970 are formed. The perovskite solar cell 930 is formed such that an electron transport layer, a perovskite absorption layer, a hole transport layer, and a transparent conductive oxide electrode layer are appropriately stacked on a front surface of the junction layer 920 according to a design of the silicon solar cell 910.

In (d) of FIG. 9, a lower electrode 940 is formed on the rear surface of the silicon solar cell 910, and an upper electrode 950 is formed on a front surface of the perovskite solar cell 930 to manufacture the tandem solar cell 900.

Meanwhile, in another embodiment, the lower electrode 940 and the upper electrode 950 may be sequentially formed. In detail, the lower electrode 940 on the rear surface of the silicon solar cell 910 may be provided first. Subsequently, after the junction layer 920, the hydrogen ion supply layer 960, and the perovskite solar cell 930 are formed on the front surface of the silicon solar cell 910, the upper electrode 950 may be formed on the front surface of the perovskite solar cell 930. Further, after the upper electrode 950 is formed, a front anti-reflection film may be provided on a surface where a transparent conductive oxide layer of the perovskite solar cell 930 is exposed and a front surface of the upper electrode.

Figure 10:
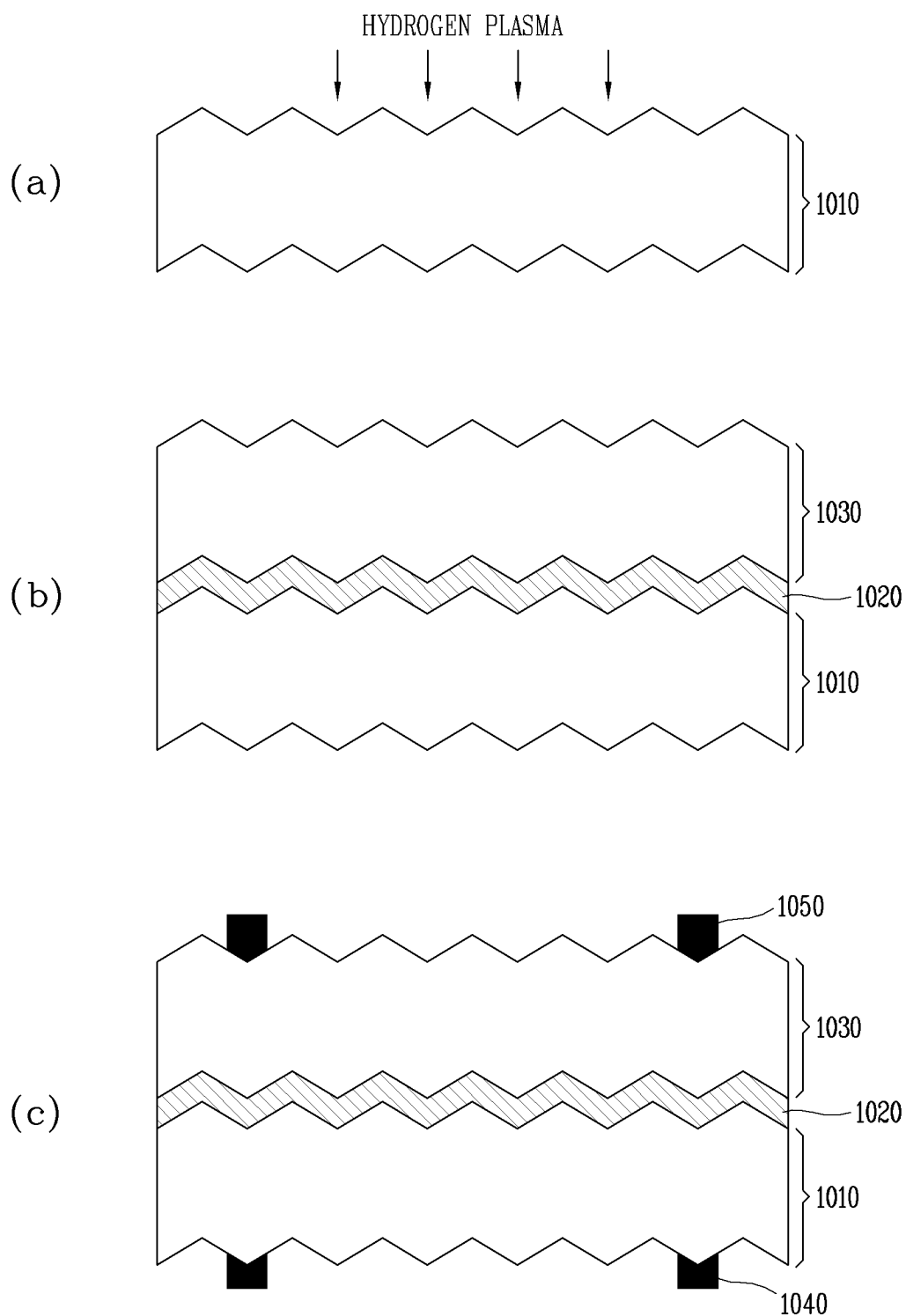
FIG. 10 is a conceptual view illustrating another embodiment of a method for manufacturing a tandem solar cell of the present disclosure.

FIG. 10 is a conceptual view illustrating another embodiment of a method for manufacturing a tandem solar cell 1000 of the present disclosure.

Referring to FIG. 10, in (a) of FIG. 10, a surface of a first conductive type semiconductor layer or a surface of a second conductive type semiconductor layer formed on a front surface of a silicon solar cell 1010 may be exposed to a hydrogen plasma. Accordingly, hydrogen is supplied to the surface of the first conductive type semiconductor layer or the surface of the second conductive type semiconductor layer formed on the front surface of the silicon solar cell 910 to stabilize defects such as dangling bonds. Accordingly, the front surface of the silicon solar cell 1010 may be hydrogen passivated to prevent recombination of carriers.

Subsequently, in (b) of FIG. 10, a junction layer 1020 and a perovskite solar cell 1030 are formed on a front surface of the silicon solar cell 1010. The perovskite solar cell 1030 is formed such that an electron transport layer, a perovskite absorption layer, a hole transport layer, and a transparent conductive oxide electrode layer are appropriately stacked on a front surface of the junction layer 1020 according to a design of the silicon solar cell 1010.

In (c) of FIG. 10, a lower electrode 1040 is formed on a rear surface of the silicon solar cell 1010, and an upper electrode 1050 is formed on a front surface of the perovskite solar cell 1030 to manufacture the tandem solar cell 1000.

In the drawing, the lower electrode 1040 and the upper electrode 1050 are formed after the perovskite solar cell 1030 is formed. However, in another embodiment, the lower electrode 1040 may be provided after preparing the silicon solar cell 1010, and the upper electrode 1050 may be provided after the perovskite solar cell 1030 is formed, so that the lower electrode 1040 and the upper electrode 1050 are sequentially and separately formed. Further, after the upper electrode 1050 is formed, a front anti-reflection film may be provided on a surface where a transparent conductive oxide layer of the perovskite solar cell 1030 is exposed and a front surface of the upper electrode.

The method for manufacturing the solar cell described above is not limited to the configurations and the methods of the embodiments described above, but the embodiments may be configured by selectively combining all or part of the embodiments so that various modifications or changes can be made.

The invention claimed is:

1. A tandem solar cell, comprising:
   a perovskite solar cell comprising a perovskite absorption layer;
   a silicon solar cell disposed below the perovskite solar cell;
   a junction layer disposed between the perovskite solar cell and the silicon solar cell;
   an upper electrode disposed on the perovskite solar cell; and
   a lower electrode disposed below the silicon solar cell,
   wherein the silicon solar cell comprises:
   a crystalline silicon substrate,
   a first conductive type semiconductor layer disposed at an upper surface of the crystalline silicon substrate,
   a second conductive type semiconductor layer disposed at the lower surface of the crystalline silicon substrate, and
   a tunnel layer disposed between the first conductive type semiconductor layer or between the second conductive type semiconductor layer,
   wherein the second conductive type semiconductor layer, the tunnel layer, the crystalline silicon substrate, and the first conductive type semiconductor layer are sequentially stacked on an upper surface of the lower electrode,
   wherein a hydrogen ion supply layer is disposed between the junction layer and the first conductive type semiconductor layer, and
   wherein:
   the first conductive type semiconductor layer or the second conductive type semiconductor layer includes a first conductive type impurity or a second conductive type impurity that is different from the first conductive type impurity,
   the crystalline silicon substrate includes the second conductive type impurity,
   one of the first conductive type semiconductor layer or the second conductive type semiconductor layer is a polycrystalline silicon layer that is spaced apart from the crystalline silicon substrate, the tunnel layer being disposed between the polycrystalline silicon layer and the crystalline silicon substrate,
   the other of the first conductive type semiconductor layer or the second conductive type semiconductor layer is disposed on the crystalline silicon substrate and passivated by hydrogen, and
   the hydrogen ion supply layer comprises a pattern having an opening through which a portion of the first conductive type semiconductor layer is exposed to the junction layer and in contact with the junction layer.

2. The tandem solar cell of claim 1, further comprising:
   an anti-reflection film disposed on a lower surface of the second conductive type semiconductor layer, wherein the lower surface of the second conductive type semiconductor layer is exposed on a rear surface of the tandem solar cell.

3. The tandem solar cell of claim 1, wherein the perovskite solar cell comprises an electron transport layer, the perovskite absorption layer, a hole transport layer, and a transparent conductive oxide electrode layer that are sequentially stacked on an upper surface of the junction layer.

4. The tandem solar cell of claim 1, wherein the perovskite absorption layer comprises at least one of organic halide perovskite and metal halide perovskite.

5. The tandem solar cell of claim 1, wherein the junction layer comprises at least one of a transparent conductive oxide material, a carbonaceous conductive material, a metallic material, a conductive polymer material, or nano-crystalline silicon.

* * * * *